(12) United States Patent
Yamada

(10) Patent No.: US 7,723,723 B2
(45) Date of Patent: May 25, 2010

(54) MEMORY

(75) Inventor: Kouichi Yamada, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 174 days.

(21) Appl. No.: 11/473,148

(22) Filed: Jun. 23, 2006

(65) Prior Publication Data

US 2006/0289943 A1    Dec. 28, 2006

(30) Foreign Application Priority Data

Jun. 24, 2005    (JP) .............................. 2005-184335

(51) Int. Cl.
*H01L 29/00*    (2006.01)
(52) U.S. Cl. ................. 257/46; 257/104; 257/E27.004; 257/E27.009; 438/130
(58) Field of Classification Search ................. 257/390, 257/46, 104, E27.004, E27.009; 438/128–132
See application file for complete search history.

(56) References Cited

U.S. PATENT DOCUMENTS

| 4,075,754 A | * | 2/1978 | Cook, Jr. ..................... 438/217 |
| 5,920,499 A | * | 7/1999 | Chang ........................ 365/105 |
| 5,990,507 A | * | 11/1999 | Mochizuki et al. .......... 257/295 |

FOREIGN PATENT DOCUMENTS

| JP | 1-185899 | | 7/1989 |
| JP | 5-275656 | A | 10/1993 |
| JP | 7-130892 | | 5/1995 |
| JP | 2000-331473 | A | 11/2000 |
| JP | 2002-141481 | A | 5/2002 |

OTHER PUBLICATIONS

Chinese Office Action, with English translation, issued in Chinese Patent Application No. CN 200610094023.9, mailed Mar. 7, 2008.

* cited by examiner

*Primary Examiner*—Kiesha R Bryant
*Assistant Examiner*—Tucker Wright
(74) *Attorney, Agent, or Firm*—McDermott Will & Emery LLP

(57) ABSTRACT

A memory allowing reduction of a memory cell size is obtained. This memory comprises a first conductive type first impurity region formed on the main surface of a semiconductor substrate for functioning as a first electrode of a diode included in a memory cell and a word line, a plurality of second conductive type second impurity regions formed on the surface of the first impurity region at a prescribed interval, each functioning as a second electrode of the diode, a bit line formed on the semiconductor substrate and connected to the second impurity regions and a wire provided above the bit line and connected to the first impurity region every prescribed interval.

20 Claims, 8 Drawing Sheets

MEMORY

BACKGROUND OF THE INVENTION

1. Field of the Invention

The present invention relates to a memory, and more particularly, it relates to a memory such as a mask ROM.

2. Description of the Background Art

A mask ROM is generally known as an exemplary memory, as disclosed in Japanese Patent Laying-Open No. 5-275656 (1993), for example. In the exemplary conventional mask ROM disclosed in the aforementioned Japanese Patent Laying-Open No. 5-275656, a transistor including a source region and a drain region is provided every memory cell. This exemplary conventional mask ROM sets data stored in each memory cell in response to whether or not a second-layer contact hole is provided for connecting the drain region of the memory cell with a wire.

In the exemplary conventional mask ROM disclosed in the aforementioned Japanese Patent Laying-Open No. 5-275656, however, the memory cell size is disadvantageously increased due to the transistor provided every memory cell.

SUMMARY OF THE INVENTION

The present invention has been proposed in order to solve the aforementioned problem, and an object of the present invention is to provide a memory allowing reduction of a memory cell size.

In order to attain the aforementioned object, a memory according to an aspect of the present invention comprises a first conductive type first impurity region formed on the main surface of a semiconductor substrate for functioning as a first electrode of a diode included in a memory cell and a word line, a plurality of second conductive type second impurity regions formed on the surface of the first impurity region at a prescribed interval, each functioning as a second electrode of the diode, a bit line formed on the semiconductor substrate and connected to the second impurity regions and a wire provided above the bit line and connected to the first impurity region every prescribed interval.

In the memory according to this aspect, as hereinabove described, the first conductive type first impurity region functioning as the first electrode of the diode included in the memory cell and the second conductive type second impurity regions each functioning as the second electrode of the diode included in the memory cell are provided on the main surface of the semiconductor substrate, so that a crosspoint memory can be formed by arranging diodes formed by such first and second impurity regions in the form of a matrix (crosspoint form). In this case, each memory cell includes a single diode, whereby the memory cell size can be reduced as compared with memory cells each including a single transistor. Further, resistance can be inhibited from increase resulting from an increased length of the first impurity region by connecting the wire provided above the bit line to the first impurity region functioning as the word line every prescribed interval, whereby reduction of the rate of rise (fall) of the word line can be suppressed.

In the memory according to the aforementioned aspect, the bit line is preferably so formed as to extend in a direction intersecting with the extensional direction of the first impurity region, and the wire is preferably so formed as to extend along the extensional direction of the first impurity region. According to this structure, the bit line and the first impurity region functioning as the word line can be so arranged as to intersect with each other, whereby diodes formed by first and second impurity regions can be easily arranged in the form of a matrix by arranging the second impurity regions on the intersections between bit lines and first impurity regions functioning as word lines. Further, the wire can be easily connected to the first impurity region every prescribed interval by performing piling on the first impurity region from the wire so formed as to extend along the extensional direction of the first impurity region every prescribed interval.

In this case, the memory preferably further comprises a first connecting hole provided below the bit line for electrically connecting the bit line and the second impurity regions with each other, and preferably switches data of the memory cell in response to whether or not the first connecting hole is provided in correspondence to a region formed with the memory cell. According to this structure, the memory can suppress inhibition of formation of the wire provided above the bit line to extend along the extensional direction of the first impurity region through the first connecting hole provided below the bit line for switching the data of the memory cell.

The memory according to the aforementioned aspect preferably further comprises a first interlayer dielectric film formed on the first impurity region and the second impurity regions and a second interlayer dielectric film formed on the first interlayer dielectric film, while the wire is preferably formed on the second interlayer dielectric film and the bit line is preferably formed between the first interlayer dielectric film and the second interlayer dielectric film. According to this structure, the wire can be easily provided above the bit line.

In the aforementioned memory comprising the first and second interlayer dielectric films, the first interlayer dielectric film preferably includes a first connecting hole for electrically connecting the bit line and the second impurity regions with each other, and a conductive first plug is preferably embedded in the first connecting hole. According to this structure, the bit line and the second impurity regions can be easily electrically connected with each other through the first plug in the memory provided with the first connecting hole.

In the aforementioned memory including the first plug, the first interlayer dielectric film is preferably so formed as to come into contact with the surfaces of the second impurity regions, and the bit line and the second impurity regions are preferably electrically connected with each other through the first plug embedded in the first connecting hole of the first interlayer dielectric film. According to this structure, the bit line and the second impurity regions can be electrically connected with each other through the first plug embedded in the first connecting hole of the first interlayer dielectric film, whereby the structure of the memory can be simplified.

The aforementioned memory electrically connecting the bit line and the second impurity regions with each other through the first plug of the first interlayer dielectric film preferably switches data of the memory cell in response to whether or not the first connecting hole is provided in correspondence to a region formed with the memory cell, and no second impurity regions are preferably provided on the region formed with the memory cell when no first connecting hole is provided in the region formed with the memory cell. According to this structure, the structure of the memory can be more simplified since no second impurity regions are provided on the region formed with the memory cell.

The aforementioned memory including the first plug preferably further comprises a third interlayer dielectric film formed between the first and second impurity regions and the first interlayer dielectric film, the third interlayer dielectric film is preferably also formed with the first connecting hole while the first plug is embedded in the first connecting hole of the third interlayer dielectric film, and the bit line and the second impurity regions are preferably electrically connected with each other through the first plugs embedded in the first connecting holes of the first and third interlayer dielectric films. According to this structure, the bit line and the second impurity regions can be easily electrically connected with each other in the structure provided with the first and third interlayer dielectric films between the bit line and the second impurity regions.

In the aforementioned memory comprising the first and third interlayer dielectric films, the first plug embedded in the first connecting hole of the first interlayer dielectric film and the first plug embedded in the first connecting hole of the third interlayer dielectric film are preferably connected with each other through a first pad layer having a larger planar dimension than the first plugs. According to this structure, the two first plugs can be connected with each other through the first pad layer also upon slight deviation in the positional relation between the first plugs embedded in the first connecting holes of the first and third interlayer dielectric films respectively.

In the aforementioned memory comprising the first and second interlayer dielectric films, the first and second interlayer dielectric films preferably include second connecting holes for electrically connecting the wire and the second impurity regions with each other every prescribed interval with respect to the first impurity region. According to this structure, the wire and the second impurity regions can be electrically connected with each other through the second connecting holes every prescribed interval with respect to the first impurity region.

In the aforementioned memory including the second connecting holes, second plugs are preferably embedded in the second connecting holes of the first and second interlayer dielectric films. According to this structure, the wire and the second impurity regions can be easily electrically connected with each other through the second plugs in the structure provided with the first and second interlayer dielectric films between the wire and the second impurity regions.

In the aforementioned memory including the second plugs, the first interlayer dielectric film is preferably so formed as to come into contact with the surface of the first impurity region, and the wire and the first impurity region are preferably electrically connected with each other through the second plugs embedded in the second connecting holes of the first and second interlayer dielectric films. According to this structure, the wire located above the bit line and the first impurity region can be electrically connected with each other through the two second plugs.

In the aforementioned memory including the second plugs of the first and second interlayer dielectric films, the second plug embedded in the second connecting hole of the first interlayer dielectric film and the second plug embedded in the second connecting hole of the second interlayer dielectric film are preferably connected with each other through a second pad layer having a larger planar dimension than the second plugs. According to this structure, the two second plugs can be connected with each other through the second pad layer also upon slight deviation in the positional relation between the second plugs embedded in the second connecting holes of the first and second interlayer dielectric films respectively.

The aforementioned memory including the second plugs of the first and second interlayer dielectric films preferably further comprises a third interlayer dielectric film formed between the first and second impurity regions and the first interlayer dielectric film, the third interlayer dielectric film is preferably also formed with the second connecting hole while the second plug is embedded in the second connecting hole of the third interlayer dielectric film, and the wire and the first impurity region are preferably electrically connected with each other through the second plugs embedded in the second connecting holes of the first, second and third interlayer dielectric films. According to this structure, the wire and the first impurity region can be easily electrically connected with each other through the three second plugs in the structure provided with the first, second and third interlayer dielectric films between the wire and the first impurity region.

In the aforementioned memory including the second plugs of the first to third interlayer dielectric films, the second plug embedded in the second connecting hole of the first interlayer dielectric film, the second plug embedded in the second connecting hole of the second interlayer dielectric film and the second plug embedded in the second connecting hole of the third interlayer dielectric film are preferably connected with each other through a second pad layer having a larger planar dimension than the second plugs. According to this structure, the three second plugs can be connected with each other through the second pad layer also upon slight deviation in the positional relation between the second plugs embedded in the second connecting holes of the first, second and third interlayer dielectric films respectively.

In the memory according the aforementioned aspect, a plurality of first impurity regions are preferably so formed as to extend in a prescribed direction and arranged along a direction intersecting with the prescribed direction, and the memory preferably further comprises a first semiconductor layer provided on an element isolation region isolating each adjacent pair of first impurity regions from each other. According to this structure, the first semiconductor layer can inhibit an impurity from reaching a portion the semiconductor substrate corresponding to the element isolation region when the first impurity regions are formed by ion-implanting the impurity into the semiconductor substrate. Thus, the memory can suppress such inconvenience that any adjacent pair of first impurity regions are rendered conductive due to the impurity reaching the portion of the semiconductor substrate corresponding to the element isolation region.

In the aforementioned memory including the first semiconductor layer, the element isolation region preferably includes an element isolation dielectric film, and the first semiconductor layer is preferably formed on the element isolation dielectric film. According to this structure, the first semiconductor layer can further inhibit the impurity from reaching the portion of the semiconductor substrate corresponding to the element isolation region when the first impurity regions are formed by ion-implanting the impurity into the semiconductor substrate through the element isolation dielectric film.

The aforementioned memory including the first semiconductor layer preferably further comprises a mask layer formed on the first semiconductor layer. According to this structure, the first semiconductor layer can further inhibit the impurity from reaching the portion of the semiconductor substrate corresponding to the element isolation region when the first impurity regions are formed by ion-implanting the impurity into the semiconductor substrate through the mask layer.

The aforementioned memory including the first semiconductor layer preferably further comprises a transistor including a gate electrode constituted of a second semiconductor layer, while the first semiconductor layer and the second semiconductor layer constituting the gate electrode of the transistor are preferably formed by the same layer. According to this structure, the first semiconductor layer and the second semiconductor layer constituting the gate electrode of the transistor can be simultaneously formed through a single step by patterning the same layer, whereby a fabrication process can be simplified.

In the aforementioned memory including the first semiconductor layer, the first semiconductor layer is preferably grounded. According to this structure, the potential of the first semiconductor layer can be fixed to 0 V. Therefore, when the semiconductor substrate provided with the element isolation region is a p-type substrate and each pair of first impurity regions adjacent to each other through the element isolation region are n-type regions, for example, the potential of the first semiconductor layer functioning as a gate electrode can be fixed to 0 V in an n-channel MOS transistor formed by the first semiconductor layer, the portion of the p-type semiconductor substrate corresponding to the element isolation region and each pair of n-type first impurity regions adjacent to each other through the element isolation region, whereby this transistor can be turned off. Thus, the memory can reliably inhibit a current from flowing between each pair of first impurity regions adjacent to each other through the element isolation region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings. The following embodiments are described with reference to mask ROMs, employed as exemplary memories according to the present invention.

First Embodiment

The structure of a mask ROM according to a first embodiment of the present invention is described with reference to FIGS. 1 to 4.

Figure 1:
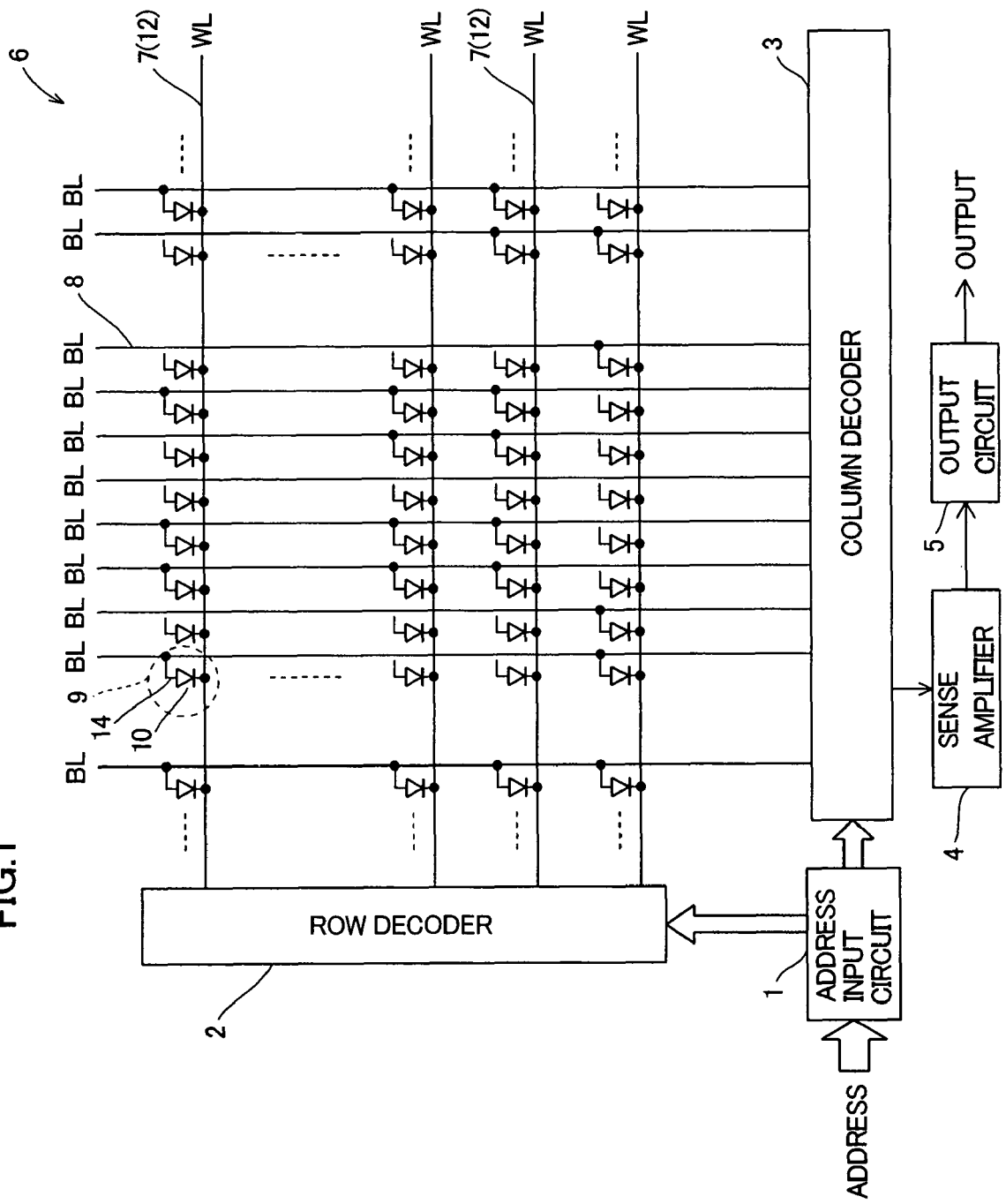
FIG. 1 is a circuit diagram showing the structure of a mask ROM according to a first embodiment of the present invention.

As shown in FIG. 1, the mask ROM according to the first embodiment comprises an address input circuit 1, a row decoder 2, a column decoder 3, a sense amplifier 4, an output circuit 5 and a memory cell array region 6. The address input circuit 1, the row decoder 2, the column decoder 3, the sense amplifier 4 and the output circuit 5 constitute peripheral circuits. Transistors (not shown) having gate electrodes of polysilicon layers are provided in these peripheral circuits. The address input circuit 1 is so formed as to output address data to the row decoder 2 and the column decoder 2 by externally receiving a prescribed address. A plurality of word lines (WL) 7 are connected to the row decoder 2. When receiving address data from the address input circuit 1, the row decoder 2 selects a word line 7 corresponding to the received address data and brings the potential of this word line 7 into a low level (GND=0 V) while setting the potentials of the remaining word lines 7 to a high level (Vcc).

A plurality of bit lines (BL) 8 arranged to intersect with the word lines (WL) 7 are connected to the column decoder 3. When receiving address data from the address input circuit 1, the column decoder 3 selects a bit line 8 corresponding to the received address data and connects the selected bit line 8 with the sense amplifier 4. The sense amplifier 4, which is a current sensing amplifier, senses a current flowing in the bit line 8 selected by the column decoder 3 for outputting a high-level signal when the quantity of the current flowing in the selected bit line 8 is in excess of a prescribed level while outputting a low-level signal when the quantity of the current flowing in the selected bit line 8 is less than the prescribed level. The output circuit 5 is so formed as to output a signal when receiving an output from the sense amplifier 4.

A plurality of memory cells 9 are arranged on the memory cell array region 6 in the form of a matrix. The plurality of memory cells 9 are arranged on the intersections between the plurality of word lines 7 and the plurality of bit lines 8 arranged to intersect with each other respectively. Thus, the mask ROM according to the first embodiment is constituted as a crosspoint mask ROM. The memory cells 9 provided on the memory cell array region 6 include those having diodes 10 whose anodes are connected to the corresponding bit lines 8 and those having diodes 10 whose anodes are not connected to the corresponding bit lines 8.

Figure 2:
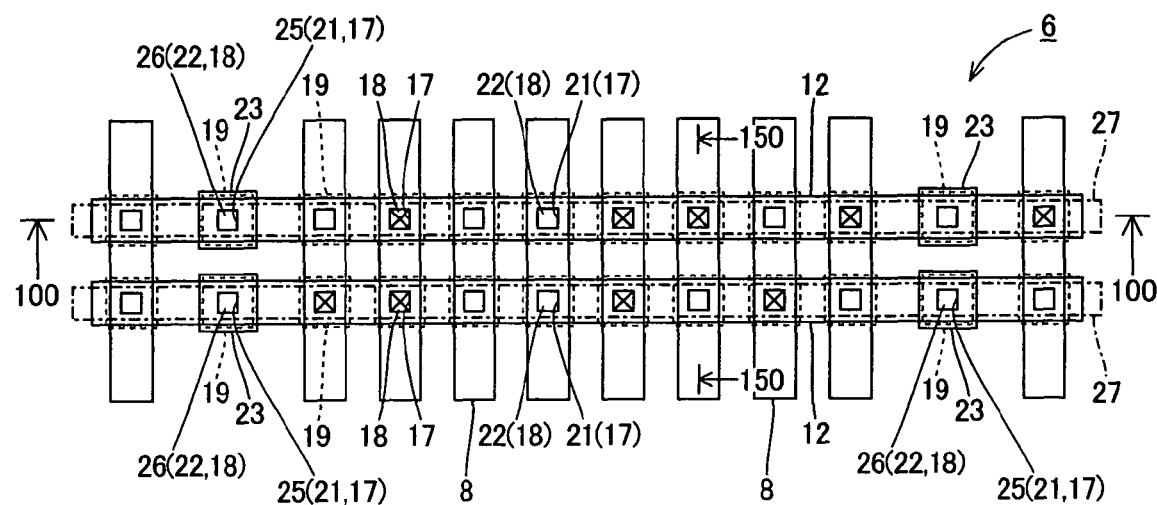
FIG. 2 is a planar layout diagram showing the structure of a memory cell array region of the mask ROM according to the first embodiment shown in FIG. 1.
Figure 3:
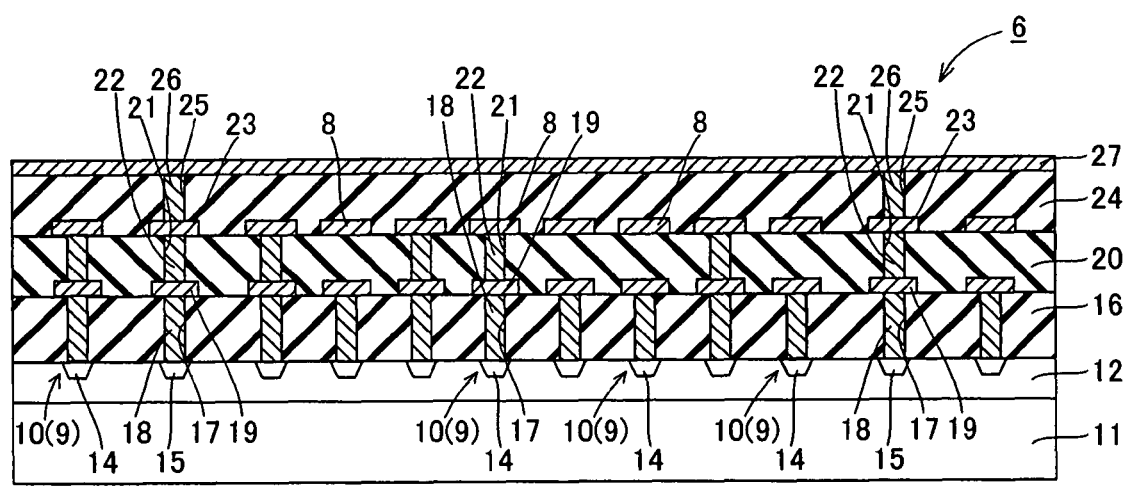
FIG. 3 is a sectional view of the mask ROM according to the first embodiment taken along the line 100-100 in FIG. 2.
Figure 4:
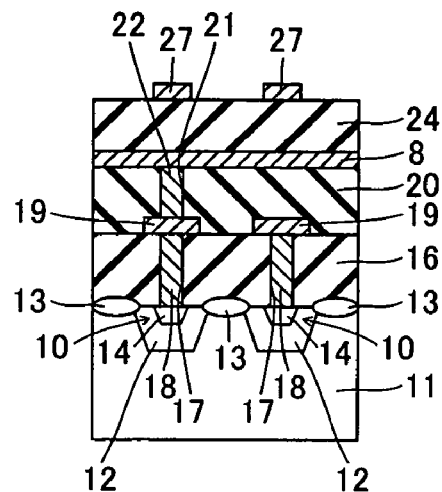
FIG. 4 is a sectional view of the mask ROM according to the first embodiment taken along the line 150-150 in FIG. 2.

In the memory cell array region 6, a plurality of n-type impurity regions 12 are formed on the upper surface of a p-type silicon substrate 11 to extend in a prescribed direction, as shown in FIGS. 2 to 4. The p-type silicon substrate 11 is an example of the "semiconductor substrate" in the present invention, and the n-type impurity regions 12 are examples of the "first impurity region" in the present invention. The plurality of n-type impurity regions 12 are formed along a direction perpendicular to the extensional direction thereof at a prescribed interval. As shown in FIG. 4, element isolation dielectric films 13 are formed between adjacent pairs of n-type impurity regions 12 respectively, in order to isolate these n-type impurity regions 12 from each other.

As shown in FIG. 3, a plurality of p-type impurity regions 14 are formed in each n-type impurity region 12 along the extensional direction of the n-type impurity region 12 at a prescribed interval. The p-type impurity regions 14 are examples of the "second impurity regions" in the present invention. Each p-type impurity region 14 and the corresponding n-type impurity region 12 form the diode 10 of each memory cell 9. Thus, each n-type impurity region 12 functions as a common cathode of a plurality of diodes 10, while the corresponding p-type impurity regions 14 function as the anodes of the corresponding diodes 10. According to the first embodiment, the n-type impurity regions 12 also function as the word lines (WL) 7 (see FIG. 1). In each n-type impurity region 12, further, an n-type contact region 15 is formed every eight p-type impurity regions 14. These n-type contact regions 15 are provided for reducing contact resistance of first-layer plugs 18 described later with respect to the n-type impurity regions 12 of the p-type silicon substrate 11.

A first interlayer dielectric film 16 is provided to cover the upper surface of the p-type silicon substrate 11. Contact holes 17 are provided in regions of the first interlayer dielectric film 16 corresponding to the p-type impurity regions 14 and the n-type contact regions 15 respectively. The first-layer plugs 18 of W (tungsten) are embedded in the contact holes 17. Thus, the first-layer plugs 18 are connected to the p-type impurity regions 14 and the n-type contact regions 15 respectively.

As shown in FIG. 3, first pad layers 19 of Al are provided on the first interlayer dielectric film 16, to be connected to the first-layer plugs 18. These pad layers 19 are substantially squared in plan view. A second interlayer dielectric film 20 is provided on the first interlayer dielectric film 16, to cover the first pad layers 19. Contact holes 21 are formed in regions of the second interlayer dielectric film 20 corresponding to the first pad layers 19. The contact holes 21 are examples of the "connecting hole" in the present invention. Second-layer plugs 22 of W are embedded in the contact holes 21. The plurality of bit lines (BL) 8 of Al are formed on the second interlayer dielectric film 20 at a prescribed interval. As shown in FIG. 2, the bit lines (BL) 8 are so formed as to extend perpendicularly to the extensional direction of the n-type impurity regions 12, and arranged to intersect with the n-type impurity regions 12 on regions corresponding to the diodes 10 of the memory cells 9 (see FIG. 3).

According to the first embodiment, the mask ROM switches data of the memory cells 9 depending on whether or not the contact holes 21 are formed between the first pad layers 19 and the bit lines (BL) 8 in correspondence to the diodes 10 of the memory cells 9. When a contact hole 21 is formed in correspondence to the diode 10 of any memory cell 9 so that the corresponding bit line (BL) 8 and the p-type impurity region 14 constituting the diode 10 of this memory cell 9 are connected with each other through the second-layer plug 22 embedded in this contact hole 21, the corresponding first pad layer 19 and the corresponding first plug 18, the mask ROM sets the data of this memory cell 9 to "1". When no contact hole 21 is formed in correspondence to the diode 10 of any memory cell 9 so that the diode 10 of this memory cell 9 and the corresponding bit line (BL) 8 are not connected with each other, on the other hand, the mask ROM sets the data of this memory cell 9 to "0".

Second pad layers 23 of Al are formed on regions of the second interlayer dielectric film 20 corresponding to the second-layer plugs 22 respectively. The second pad layers 23, substantially squared in plan view, are connected with the second-layer plugs 22. A third interlayer dielectric film 24 is provided on the second interlayer dielectric film 20, to cover the bit lines (BL) 8 and the second pad layers 23. Contact holes 25 are provided in regions of the third interlayer dielectric film 24 corresponding to the second pad layers 23, and third-layer plugs 26 of W are embedded in these contact holes 25. Thus, the third-layer plugs 26 are connected to the second pad layers 23.

A plurality of wiring layers 27 of Al are formed on the third interlayer dielectric film 24, to extend along the extensional direction of the n-type impurity regions 12. The plurality of wiring layers 27, provided along the direction perpendicular to the extensional direction at a prescribed interval, are arranged above the n-type impurity regions 12 respectively. These wiring layers 27 are connected to the third-layer plugs 26. Thus, the wiring layers 27 and the n-type impurity regions 12 are connected with each other every eight memory cells 9 (prescribed interval) through the third-layer plugs 26, the second pad layers 23, the second-layer plugs 21, the first pad layers 19 and the first-layer plugs 18. When selecting any word line 7 corresponding to address data received in the row decoder 2 (see FIG. 1), the mask ROM according to the first embodiment brings the potential of the selected word line 7 (n-type impurity region 12) into the low level (GND=0 V) through the corresponding wiring layer 27 while setting the potentials of the remaining word lines 7 (n-type impurity regions 12) to the high level (Vcc) through the corresponding wiring layers 27.

Operations of the mask ROM according to the first embodiment are now described with reference to FIGS. 1 and 2. First, the address input circuit 1 (see FIG. 1) receives a prescribed address. Thus, the address input circuit 1 outputs address data responsive to the received address to the row decoder 2 and the column decoder 3 respectively. The row decoder 2 decodes the address data, thereby selecting a prescribed word line 7 corresponding thereto. The mask ROM brings the potential of the selected word line 7 (n-type impurity region 12) to the low level (GND) through the corresponding wiring layer 27 (see FIG. 2), while setting the potentials of the remaining word lines 7 to the high level (Vcc) through the corresponding wiring layers 27.

On the other hand, the column decoder 3 receiving the address data from the address input circuit 1 (see FIG. 1) selects a prescribed bit line 8 corresponding to the received address data, and connects the selected bit line 8 to the sense amplifier 4. Then, the sense amplifier 4 supplies a potential close to Vcc to the selected bit line 8. If the anode of the diode 10 of the selected memory cell 9 located on the intersection between the selected word line 7 and the selected bit line 8 is linked to the bit line 8, a current flows from the sense amplifier 4 to the word line 7 through the bit line 8 and the diode 10. At this time, the sense amplifier 4 senses that the quantity of the current flowing in the bit line 8 is in excess of the prescribed level, and outputs a high-level signal. The output circuit 5 receiving this output signal from the sense amplifier 4 outputs a high-level signal.

If the anode of the diode 10 of the selected memory cell 9 located on the intersection between the selected word line 7 and the selected bit line 8 is not linked to the bit line 8, on the other hand, no current flows from the bit line 8 to the word line 7. In this case, the sense amplifier 4 senses that no current flows to the word line 7, and outputs a low-level signal. The output circuit 5 receiving this output signal from the sense amplifier 4 outputs a low-level signal.

A fabrication process for the memory cell array region 6 of the mask ROM according to the first embodiment is now described with reference to FIGS. 2 to 8.

Figure 5:
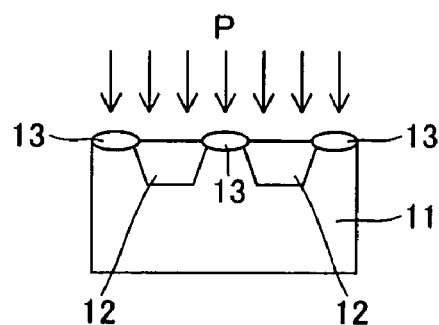
FIGS. 5 to 8 are sectional views for illustrating a fabrication process for the memory cell array region of the mask ROM according to the first embodiment of the present invention.

As shown in FIG. 5, the element isolation dielectric films 13 constituted of LOCOS (local oxidation of silicon) films are formed on the upper surface of the p-type silicon substrate 11. Then, gate insulating films (not shown) of the transistors (not shown) included in the aforementioned peripheral circuits are formed, and the polysilicon layers (not shown) constituting the gate electrodes of the transistors are formed on these gate insulating films. Thereafter P (phosphorus) is ion-implanted into the p-type silicon substrate 11 under conditions of implantation energy of about 100 keV and a dose (quantity of implantation) of about $3.5 \times 10^{13}$ cm$^{-2}$. Thus, the plurality of n-type impurity regions 12 are formed on the p-type silicon substrate 11 in the state isolated from each other through the element isolation dielectric films 13.

Figure 6:
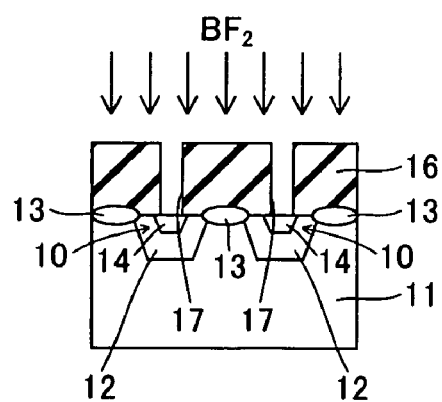

As shown in FIG. 6, the first interlayer dielectric film 16 is formed to cover the overall surface. Then, the contact holes 17 are formed in the regions of the first interlayer dielectric film 16 corresponding to the n-type impurity regions 12 by photolithography and etching. Thereafter resist films (not shown) are formed to cover regions of the first interlayer dielectric film 16 other than those for forming the n-type contact regions 15 (see FIG. 3). Then, P (phosphorus) is ion-implanted into the n-type impurity regions 12 through the contact holes 17 under conditions of implantation energy of about 25 keV and a dose of about $3.0 \times 10^{14}$ cm$^{-2}$, thereby forming the n-type contact regions 15. Thereafter the aforementioned resist films (not shown) are removed.

Then, other resist films (not shown) are formed to cover regions of the first interlayer dielectric film 16 other than those for forming the n-type impurity regions 14 (see FIG. 6). Then, BF$_2$ is ion-implanted into the n-type impurity regions 12 through the contact holes 17 under conditions of implantation energy of about 40 keV and a dose of about $3.0 \times 10^{14}$ cm$^{-2}$, thereby forming the plurality of p-type impurity regions 14 in the n-type impurity regions 12. The plurality of p-type impurity regions 14 and the n-type impurity regions 12 form the plurality of diodes 10. Thereafter the aforementioned resist films (not shown) are removed.

Figure 7:
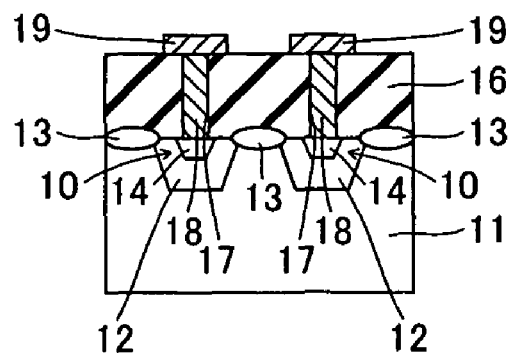

As shown in FIG. 7, the first-layer plugs 18 of W are formed to fill up the contact holes 17. Thus, the first-layer plugs 18 are connected to the p-type impurity regions 14 and the n-type contact regions 15 (see FIG. 3) respectively. Then, the first pad layers 19 of Al are formed on the first interlayer dielectric film 16 by photolithography and etching, to be connected to the first-layer plugs 19. At this time, the first pad layers 19 are substantially squared in plan view.

Figure 8:
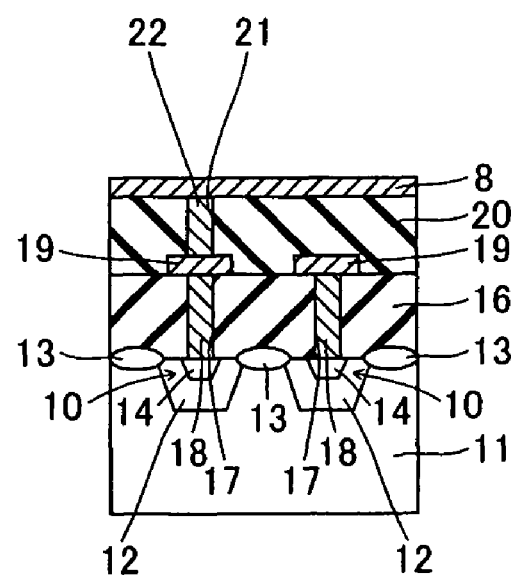

As shown in FIG. 8, the second interlayer dielectric film 20 is formed on the first interlayer dielectric film 16, to cover the first pad layers 19. Thereafter the contact holes 21 are formed in the regions corresponding to the first pad layers 19. Then, the second-layer plugs 22 of W are embedded in the contact holes 21. According to the firs embodiment, the contact holes 21 and the second-layer plugs 22 are provided for the p-type impurity regions 14, serving as the anodes of the diodes 10, connected to the bit lines 8, while neither contact holes 21 nor second-layer plugs 22 are provided for the p-type impurity regions 14, serving as the anodes of the diodes 10, not connected to the bit lines 8.

Then, the plurality of bit lines 8 of Al are formed on the second interlayer dielectric film 20 by photolithography and etching to extend perpendicularly to the extensional direction of the n-type impurity regions 12, while the second pad layers 23 (see FIG. 3) of Al are formed to be connected to the second-layer plugs 22 linked to the n-type contact regions 15. The plurality of bit lines 8 are formed at the prescribed interval, to pass over the regions corresponding to the p-type impurity regions 14. On the regions provided with the second-layer plugs 22, therefore, the bit lines 8 and the p-type impurity regions 14 serving as the anodes of the diodes 10 are connected with each other through the second-layer plugs 22, the first pad layers 19 and the first-layer plugs 18. On the regions provided with no second-layer plugs 22, on the other hand, the bit lines 8 are not connected with the first pad layers 19, not to be connected to the p-type impurity regions 14 serving as the anodes of the diodes 10. Thus, the diodes 10 having the anodes connected to the bit lines 8 correspond to data "1", while the diodes 10 having the anodes not connected to the bit lines 8 correspond to data "0". The second pad layers 23 are substantially squared in plan view.

As shown in FIGS. 3 and 4, the third interlayer dielectric film 24 is formed on the second interlayer dielectric film 20, to cover the bit lines 8 and the second pad layers 23. Then, the wiring layers 27 of Al are formed on the regions of the third interlayer dielectric film 24 corresponding to the n-type impurity regions 12, to extend along the extensional direction of the n-type impurity regions 12. Thus, the wiring layers 27 and the third-layer plugs 26 are connected with each other on the regions provided with the third-layer plugs 26, as shown in FIG. 3. Therefore, the wiring layers 27 and the n-type impurity regions 12 are connected with each other through the third-layer plugs 26, the second pad layers 23, the second-layer plugs 22, the first pad layers 19, the first-layer plugs 18 and the n-type contact regions 15. The memory cell array region 6 of the mask ROM according to the first embodiment shown in FIG. 3 is formed in the aforementioned manner.

According to the first embodiment, as hereinabove described, a crosspoint mask ROM can be formed by forming the diodes 10 constituted of the n-type impurity regions 12 and the p-type impurity regions 14 on the upper surface of the p-type silicon substrate 11 while arranging these diodes 10 in the form of a matrix. Thus, the memory cells 9 of the crosspoint mask ROM include the single diodes 10 respectively, whereby the memory cell size can be reduced as compared with a conventional mask ROM having memory cells including single transistors respectively.

According to the first embodiment, further, the wiring layers 27 provided above the bit lines 8 are piled every prescribed interval with respect to the n-type impurity regions 12 serving as the word lines 7 so that resistance can be inhibited from increase resulting from an increased length of the n-type impurity regions 12, whereby reduction of the rate of fall (rise) of the word lines 7 can be suppressed.

According to the first embodiment, in addition, the mask ROM can suppress inhibition of formation of the wiring layers 27 provided above the bit lines 8 to extend along the extensional direction of the n-type impurity regions 12 through the contact holes 21 and the plugs 22 provided below the bit lines 8 by switching the data "1" and "0" of the memory cells 9 depending on whether or not the contact holes 21 and the plugs 22 for connecting the bit lines 8 and the p-type impurity regions 14 with each other are formed on the second interlayer dielectric film 20 located below the bit lines 8 in correspondence to the regions formed with the memory cells 9.

Second Embodiment

The structure of a mask ROM according to a second embodiment of the present invention is now described with reference to FIGS. 9 and 10.

Figure 9:
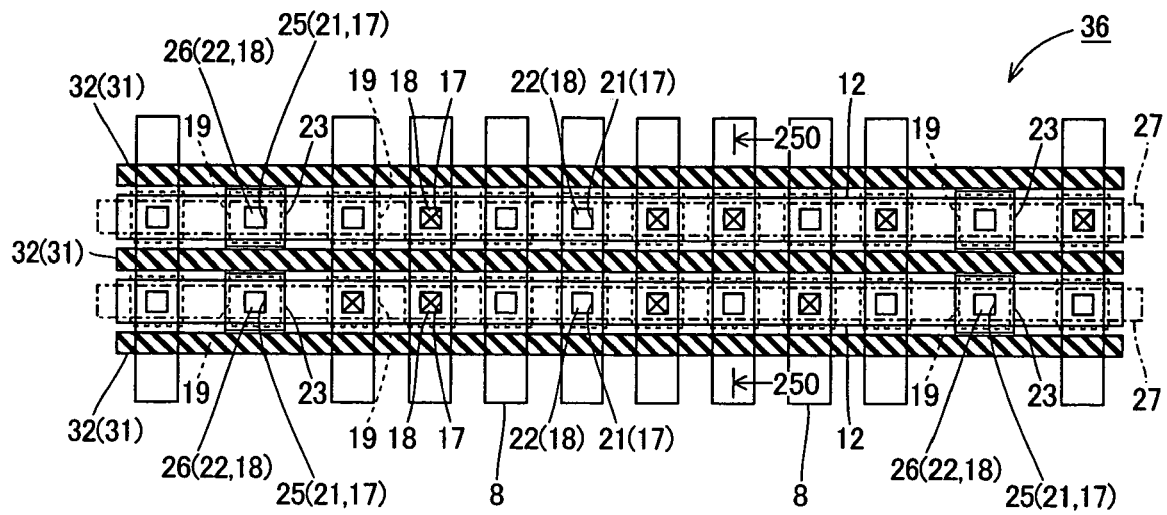
FIG. 9 is a planar layout diagram showing the structure of a memory cell array region of a mask ROM according to a second embodiment of the present invention.
Figure 10:
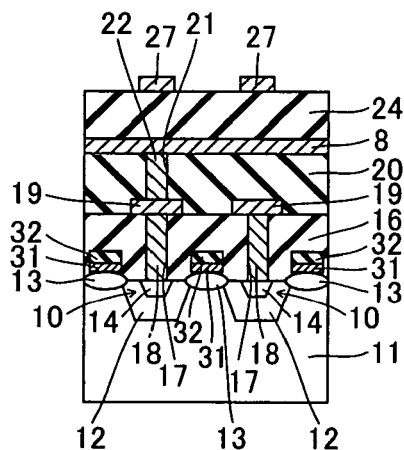
FIG. 10 is a sectional view of the memory cell array region of the mask ROM according to the second embodiment taken along the line 250-250 in FIG. 9.

In the mask ROM according to the second embodiment, polysilicon layers 31 having a thickness of about 200 nm are formed on element isolation dielectric films 13 constituted of LOCOS films provided in a memory cell array region 36 while hard masks 32 of $SiO_2$ having a thickness of about 180 nm are formed on the polysilicon layers 31 as shown in FIGS. 9 and 10, dissimilarly to the aforementioned first embodiment. The polysilicon layers 31 are so grounded that the potentials thereof are fixed to 0 V. These polysilicon layers 31 are examples of the "first semiconductor layer" in the present invention. The polysilicon layers 31 are formed by patterning the same layers as polysilicon layers (not shown) constituting gate electrodes of transistors (not shown) provided on peripheral circuits. The polysilicon layers constituting the gate electrodes of the transistors provided on the peripheral circuits are examples of the "second semiconductor layer" in the present invention. The remaining structure of the mask ROM according to the second embodiment is similar to that of the mask ROM according to the aforementioned first embodiment.

A fabrication process for the memory cell array region 36 of the mask ROM according to the second embodiment of the present invention is now described with reference to FIGS. 9 to 11.

According to the second embodiment, the element isolation dielectric films 13 are first formed on the upper surface of a p-type silicon substrate 11, similarly to the aforementioned first embodiment. Thereafter the polysilicon layers 31 having the thickness of about 200 nm are formed by photolithography and etching on the element isolation dielectric films 13 in the memory cell array region 36 (see FIG. 9), as shown in FIG. 11. At this time, the polysilicon layers 31 provided in the memory cell array region 36 and the polysilicon layers (not shown) constituting the gate electrodes of the transistors (not shown) provided on the peripheral circuits are formed by patterning the same polysilicon layers.

Thereafter the hard masks 32 of $SiO_2$ having the thickness of about 180 nm are formed by photolithography and etching on the polysilicon layers 31 provided in the memory cell array region 36. Then, P (phosphorus) is ion-implanted into the p-type silicon substrate 11 under conditions of implantation energy of about 100 keV and a dose (quantity of implantation) of about $3.5 \times 10^{13}$ cm$^{-2}$. According to the second embodiment, the polysilicon layers 31 and the hard masks 32 prevent regions of the p-type silicon substrate 11 located under the element isolation dielectric films 31 in the memory cell array region 36 against implantation of P (phosphorus), which is an n-type impurity. Thus, a plurality of n-type impurity regions 12 are formed on the p-type silicon substrate 11 in the memory cell array region 36, in a state isolated from each other through the element isolation dielectric films 13. Thereafter the memory cell array region 36 of the mask ROM according to the second embodiment shown in FIG. 9 is formed through steps similar to those of the aforementioned first embodiment shown in FIGS. 6 to 8.

According to the second embodiment, as hereinabove described, the polysilicon layers 31 and the hard masks 32 provided on the element isolation dielectric films 13 isolating adjacent pairs of n-type impurity regions 12 from each other can inhibit the n-type impurity from reaching the surface of the p-type silicon substrate 11 through the element isolation dielectric films 13 when the n-type impurity regions 12 are formed by ion-implanting the impurity. Thus, the mask ROM can suppress such inconvenience that the adjacent pairs of n-type impurity regions 12 are rendered conductive due to the n-type impurity reaching the regions of the p-type silicon substrate 11 located under the element isolation dielectric films 13.

According to the second embodiment, further, the polysilicon layers 31 provided on the element isolation dielectric films 13 in the memory cell array region 36 and the polysilicon layers constituting the gate electrodes of the transistors included in the peripheral circuits are simultaneously formed through a single step by patterning the same polysilicon layers, whereby the fabrication process can be simplified.

According to the second embodiment, in addition, the polysilicon layers 31 located on the element isolation dielectric films 13 provided in the memory cell array region 36 are grounded so that the potentials thereof are fixed to 0 V, whereby the potentials of the polysilicon layers 31 serving as gate electrodes in n-channel MOS transistors constituted of the polysilicon layers 31, p-type regions located under the element isolation dielectric films 13 and the pairs of n-type impurity regions 12 adjacent to each other through the element isolation dielectric films 12 can be fixed to 0 V for turning off the transistors. Thus, the mask ROM can reliably inhibit a current from flowing between the pairs of n-type impurity regions 12 adjacent to each other through the element isolation dielectric films 13.

The remaining effects of the second embodiment are similar to those of the aforementioned first embodiment.

Third Embodiment

The structure of a mask ROM according to a third embodiment of the present invention is now described with reference to FIGS. 12 and 13.

Figure 12:
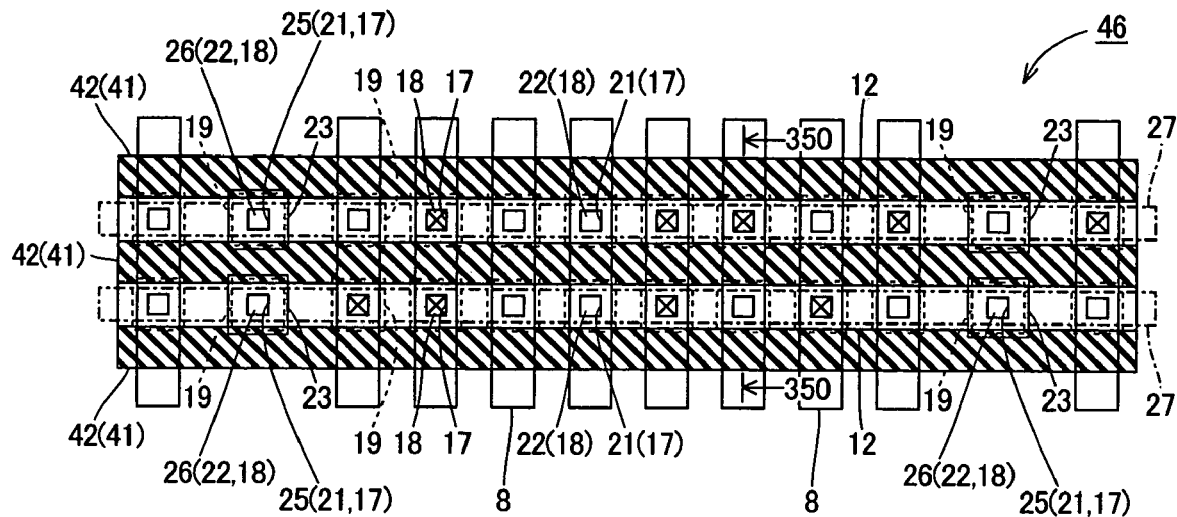
FIG. 12 is a planar layout diagram showing the structure of a memory cell array region of a mask ROM according to a third embodiment of the present invention.
Figure 13:
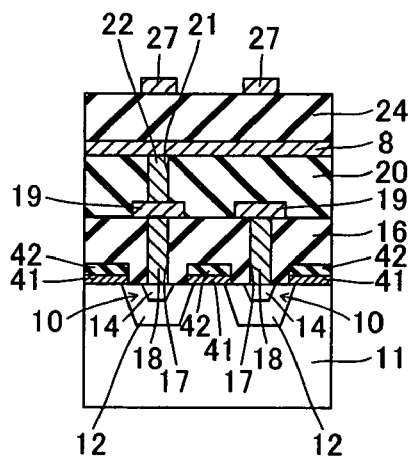
FIG. 13 is a sectional view of the memory cell array region of the mask ROM according to the third embodiment taken along the line 350-350 in FIG. 12.

In the mask ROM according to the third embodiment, no element isolation dielectric films are provided in a memory cell array region 46 for isolating a plurality of n-type impurity regions 12 from each other as shown in FIGS. 12 and 13, dissimilarly to the aforementioned first embodiment. Polysilicon layers 41 having a thickness of about 200 nm are formed on regions of a p-type silicon substrate 11 located between adjacent pairs of n-type impurity regions 12, while hard masks 42 of $SiO_2$ having a thickness of about 180 nm are formed on the polysilicon layers 41. The polysilicon layers 41 are so grounded that the potentials thereof are fixed to 0 V. These polysilicon layers 41 are examples of the "first semiconductor layer" in the present invention. The polysilicon layers 41 are formed by patterning the same layers as polysilicon layers (not shown) constituting gate electrodes of transistors (not shown) provided on peripheral circuits. The remaining structure of the mask ROM according to the third embodiment is similar to that of the mask ROM according to the aforementioned first embodiment.

A fabrication process for the memory cell array region 46 of the mask ROM according to the third embodiment of the present invention is now described with reference to FIGS. 12 to 14.

Figure 14:
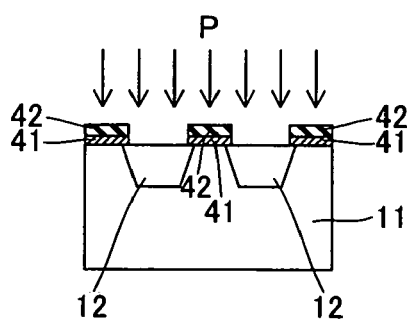
FIG. 14 is a sectional view for illustrating a fabrication process for the memory cell array region of the mask ROM according to the third embodiment of the present invention.

According to the third embodiment, the plurality of polysilicon layers 41 having the thickness of about 200 nm are formed by photolithography and etching on a p-type silicon substrate 11, as shown in FIG. 14. At this time, the polysilicon layers 41 provided in the memory cell array region 46 (see FIG. 12) and polysilicon layers (not shown) constituting gate electrodes of transistors (not shown) provided on peripheral circuits are formed by patterning the same polysilicon layers. Then, the hard masks 42 of SiO$_2$ having the thickness of about 180 nm are formed on the polysilicon layers 41 by photolithography and etching. Thereafter P (phosphorus) is ion-implanted into the p-type silicon substrate 11 under conditions similar to those in the aforementioned second embodiment. According to the third embodiment, the polysilicon layers 41 and the hard masks 42 prevent regions of the p-type silicon substrate 11 located under the adjacent pairs of n-type impurity regions 12 against implantation of P (phosphorus), which is an n-type impurity. Thus, the n-type impurity regions 12 are formed on regions of the p-type silicon substrate 11 corresponding to the spaces between adjacent pairs of polysilicon layers 41 provided in the memory cell array region 46 (see FIG. 12) respectively, as shown in FIG. 14. Thereafter the memory cell array region 46 of the mask ROM according to the third embodiment shown in FIG. 12 is formed through steps similar to those of the aforementioned first embodiment shown in FIGS. 6 to 8.

According to the third embodiment, as hereinabove described, the polysilicon layers 41 and the hard masks 42 provided on p-type element isolation regions between the adjacent pairs of n-type impurity regions 12 can prevent the p-type element isolation regions against implantation of the n-type impurity when the n-type impurity regions 12 are formed by ion-implanting the impurity. Thus, the mask ROM can suppress such inconvenience that the adjacent pairs of n-type impurity regions 12 are rendered conductive due to the n-type impurity implanted into the p-type element isolation regions.

The remaining effects of the third embodiment are similar to those of the aforementioned first embodiment.

Fourth Embodiment

The structure of a mask ROM according to a fourth embodiment of the present invention is now described with reference to FIGS. 15 to 18.

Figure 15:
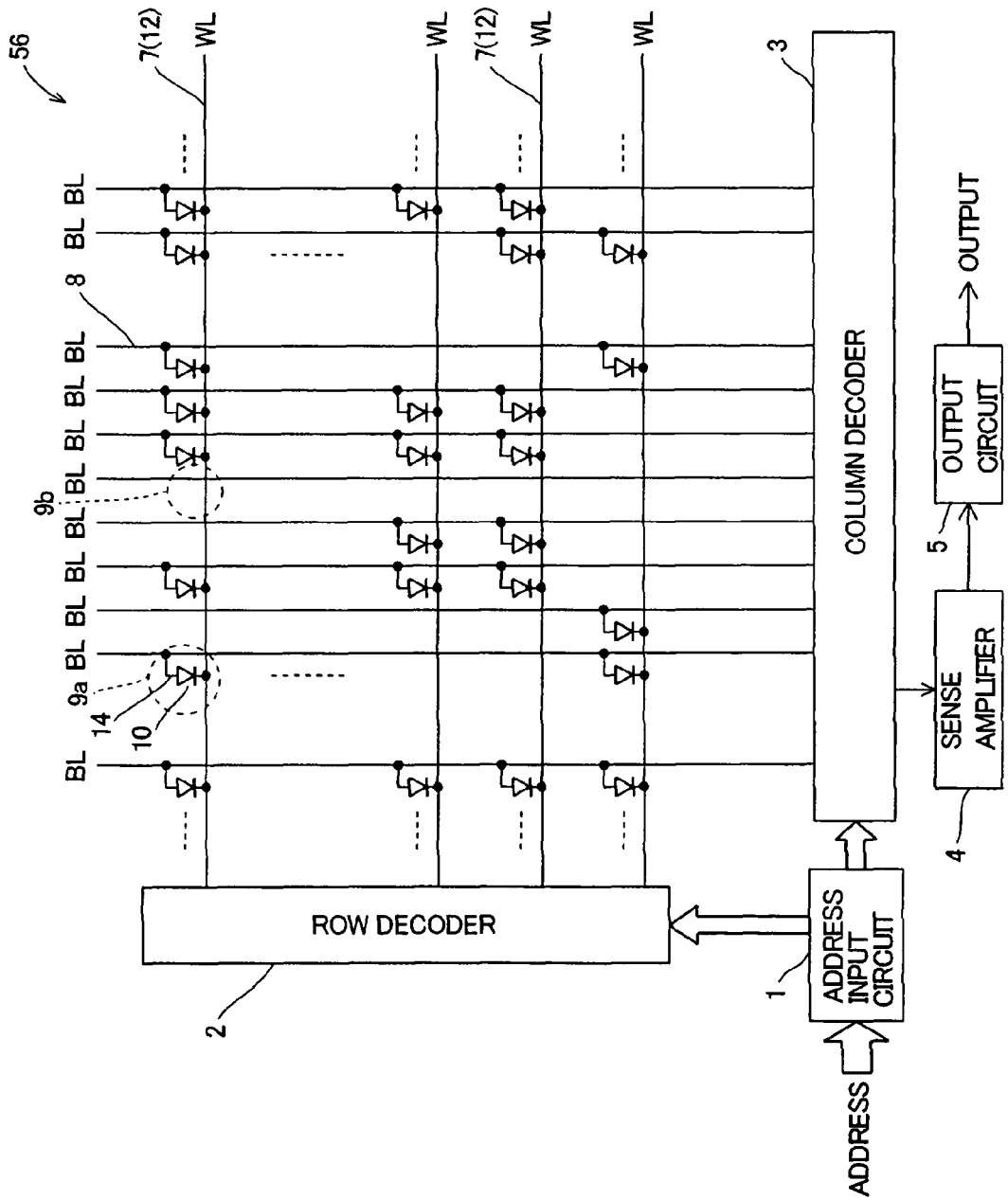
FIG. 15 is a circuit diagram showing the structure of a mask ROM according to a fourth embodiment of the present invention.
Figure 17:
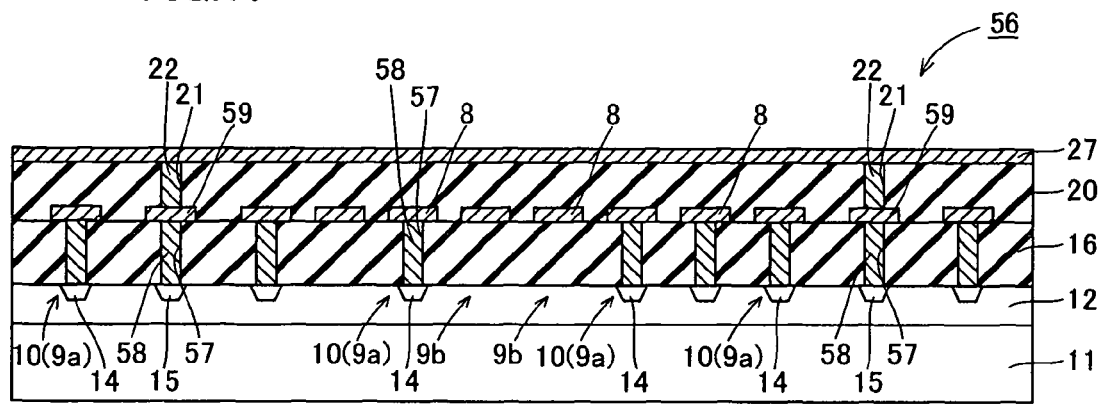
FIG. 17 is a sectional view of memory cell array region of the mask ROM according to the fourth embodiment taken along the line 400-400 in FIG. 16.

As shown in FIG. 17, the mask ROM according to the fourth embodiment switches data of memory cells 9a and 9b between "1" and "0" depending on whether or not contact holes 57 and first-layer plugs 58 are provided in a first interlayer dielectric film 16 in correspondence to regions formed with the memory cells 9a and 9b, dissimilarly to the aforementioned first embodiment. The contact holes 57 are examples of the "connecting hole" in the present invention. More specifically, the memory cells 9a including diodes 10 connected to word lines 7 and a plurality of bit lines 8 and the memory cells 9b including no diodes 10 are provided on a memory cell array region 56 of the mask ROM according to the fourth embodiment, as shown in FIG. 15.

Figure 16:
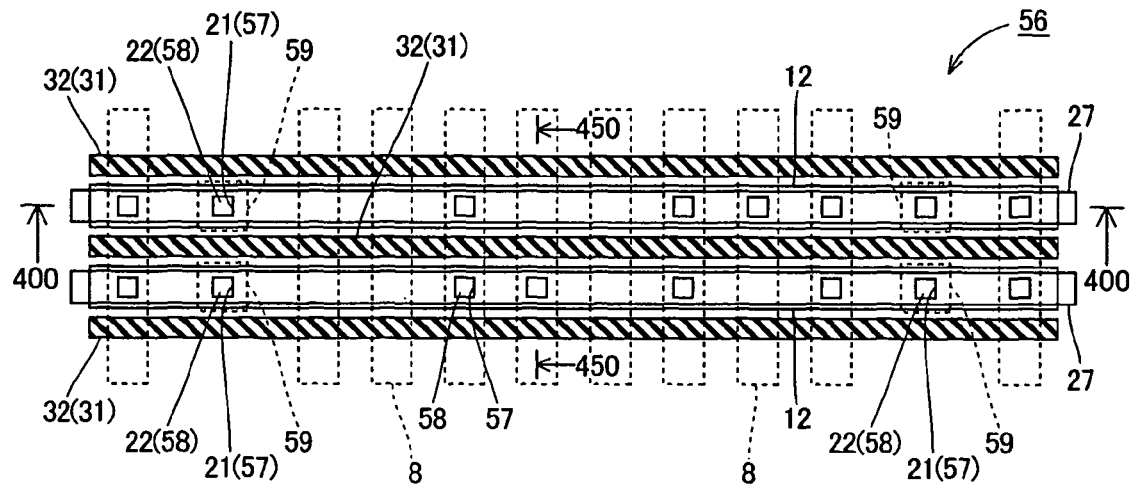
FIG. 16 is a planar layout diagram showing the structure of a memory cell array region of the mask ROM according to the fourth embodiment shown in FIG. 15.

In the regions formed with the memory cells 9a including the diodes 10, the contact holes 57 are formed in the first interlayer dielectric film 16 to correspond to p-type impurity regions 14 serving as the anodes of the diodes 10, as shown in FIGS. 16 and 17. Further, the first-layer plugs 58 of W are formed to fill up the contact holes 57. Thus, the first-layer plugs 58 connect the bit lines 8 and the p-type impurity regions 14 serving as the anodes of the diodes 10 with each other. On the other hand, no p-type impurity regions 14 are formed on the regions formed with the memory cells 9b including no diodes 10. Further, neither contact holes 57 nor first-layer plugs 58 are formed in regions of the first interlayer dielectric film 16 corresponding to the regions formed with the memory cells 9b. Thus, the mask ROM according to the fourth embodiment is provided with the memory cells 9a holding the data "1" and the memory cells 9b holding the data "0" respectively.

Figure 18:
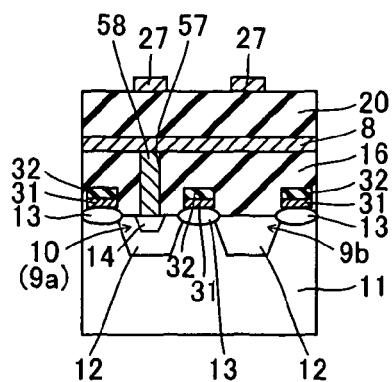
FIG. 18 is a sectional view of memory cell array region of the mask ROM according to the fourth embodiment taken along the line 450-450 in FIG. 16.

According to the fourth embodiment, further, wiring layers 27 are provided on a second interlayer dielectric film 20, as shown in FIG. 17. The wiring layers 27 and a plurality of n-type impurity regions 12 are connected with each other through second-layer plugs 22, first pad layers 59, the first-layer plugs 58 and n-type contact regions 15. As shown in FIG. 18, grounded polysilicon layers 31 and hard masks 32 similar to those in the aforementioned second embodiment are formed on element isolation dielectric films 13 isolating the plurality of n-type impurity regions 12 of the memory cell array region 56 (see FIG. 16) from each other. The remaining structure of the mask ROM according to the fourth embodiment is similar to that of the mask ROM according to the aforementioned first embodiment.

A fabrication process for the memory cell array region 56 of the mask ROM according to the fourth embodiment of the present invention is now described with reference to FIGS. 16 to 18.

Figure 11:
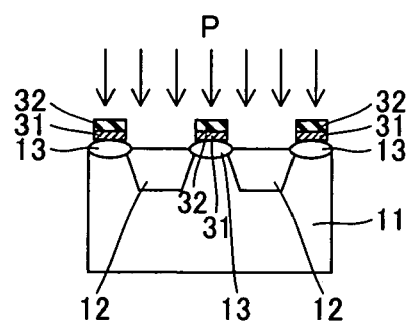
FIG. 11 is a sectional view for illustrating a fabrication process for the memory cell array region of the mask ROM according to the second embodiment of the present invention.

According to the fourth embodiment, the element isolation dielectric films 13 are formed on a p-type silicon substrate 11 while the polysilicon layers 31 and the hard masks 32 are formed on the element isolation dielectric films 13 in the memory cell array region 56 (see FIG. 16), through a step similar to that of the aforementioned second embodiment shown in FIG. 11. Thereafter P (phosphorus) is ion-implanted under conditions similar to those in the second embodiment, thereby forming the plurality of n-type impurity regions 12 isolated from each other through the element isolation dielectric films 13 in the memory cell array region 56 (see FIG. 16).

Then, the p-type impurity regions 14, the n-type contact regions 15, the first interlayer dielectric film 16, the contact holes 57 (see FIG. 18) and the first-layer plugs 58 are formed through steps similar to those of the aforementioned first embodiment shown in FIGS. 6 and 7. According to the fourth embodiment, the contact holes 57 and the first-layer plugs 58 are provided for the p-type impurity regions 14, serving as the anodes of the diodes 10, connected to the bit lines 8, while neither contact holes 57 nor first-layer plugs 58 are provided for the p-type regions 14, serving as the anodes of the diodes 10, not connected to the bit lines 8.

As shown in FIGS. 17 and 18, the plurality of bit lines 8 of Al are formed on the first interlayer dielectric film 16 to extend perpendicularly to the extensional direction of the n-type impurity regions 12 while the first pad layers 59 of Al are formed to be connected to the first-layer plugs 58 linked to the n-type contact regions 15. The plurality of bit lines 8 are formed at a prescribed interval, to pass over regions corresponding to the p-type impurity regions 14. Thus, the bit lines 8 and the p-type impurity regions 14 serving as the anodes of the diodes 10 are connected with each other through the first-layer plugs 58 in the regions provided with the first-layer plugs 58. On the other hand, the bit lines 8 and the p-type impurity regions 14 serving as the anodes of the diodes 10 are not connected with each other on the regions provided with no first-layer plugs 58. Thus, the mask ROM is provided with the diodes 10, corresponding to the data "1", having the anodes connected to the bit lines 8 and the diodes 10, corresponding to the data "0", having the anodes not connected to the bit lines 8.

Thereafter the second interlayer dielectric film 20 is formed on the first interlayer dielectric film 16, to cover the bit lines 8 and the first pad layers 59. Then, contact holes 21 are formed in portions of the second interlayer dielectric film 20 corresponding to the first pad layers 59 linked to the n-type contact regions 15. Thereafter the second-layer plugs 22 of W are formed to fill up the contact holes 21. Then, the wiring layers 27 of Al are formed on regions of the second interlayer dielectric film 20 corresponding to the n-type impurity regions 12, to extend along the extensional direction of the n-type impurity regions 12. Thus, the wiring layers 27 linked to the n-type contact regions 15 and the second-layer plugs 22 are connected with each other, as shown in FIG. 17. Therefore, the wiring layers 27 and the n-type impurity regions 12 are connected with each other through the second-layer plugs 22, the first pad layers 59, the first-layer plugs 58 and the n-type contact regions 15. The memory cell array region 56 of the mask ROM according to the fourth embodiment shown in FIG. 17 is formed in the aforementioned manner.

According to the fourth embodiment, as hereinabove described, the memory cells 9a include single-diodes 10 respectively so that the memory cell size can be reduced similarly to the aforementioned first embodiment, while the polysilicon layers 31 and the hard masks 32 formed on the element isolation dielectric films 13 can suppress conduction between adjacent pairs of n-type impurity regions 12 similarly to the aforementioned second embodiment.

According to the fourth embodiment, the bit lines 8 provided on the first interlayer dielectric film 16 and the p-type impurity regions 14 serving as the anodes of the diodes 10 are connected with each other through the contact holes 57 and the first-layer plugs 58 formed in the first interlayer dielectric film 16 so that no pad layers 19 may be provided between first-layer plugs 18 and the second-layer plugs 22, dissimilarly to the case of connecting the bit lines 8 provided on the second interlayer dielectric film 20 and the p-type impurity regions 14 serving as the anodes of the diodes 10 through the second-layer plugs 22, the first pad layers 19 and the first-layer plugs 18 according to the aforementioned first embodiment shown in FIG. 3. The minimum resolution size of the pattern, square in plan view, of the pad layers 19 according to the first embodiment shown in FIG. 3 is larger than that of the linear pattern of the bit lines 8. When a fabrication apparatus of the same resolution is employed, therefore, the minimum pitch between the adjacent pad layers 19 is larger than the minimum pitch between the adjacent bit lines 8. In the structure shown in FIG. 3, the pitch between the bit lines 8 formed on the pad layers 19 through the plugs 22 corresponds to the minimum pitch between the pad layers 19, i.e., is larger than the minimum pitch between the bit lines 8, also when the pitch between the pad layers 19 is set to the minimum level. Therefore, it is difficult to reduce the pitch between the adjacent pairs of bit lines 8. According to the fourth embodiment, on the other hand, the mask ROM requires no pad layers 19 dissimilarly to the first embodiment, whereby the pitch between the adjacent bit lines 8 can be set to the minimum level. Thus, the memory cell array region 56 of the mask ROM according to the fourth embodiment can be downsized.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to the mask ROM in each of the aforementioned first to fourth embodiments, the present invention is not restricted to this but is also applicable to a memory other than the mask ROM.

While the plurality of n-type impurity regions are isolated from each other through the LOCOS films serving as element isolation regions in each of the aforementioned first to fourth embodiments, the present invention is not restricted to this but the plurality of n-type impurity regions may alternatively be isolated from each other by STI (shallow trench isolation) or another element isolation method.

While the sense amplifier outputs a high-level signal when the quantity of the current flowing in the selected bit line is in excess of the prescribed level while outputting a low-level signal when the quantity of the current flowing in the selected bit line is less than the prescribed level in the aforementioned first embodiment, the present invention is not restricted to this but the sense amplifier may alternatively output a low-level signal when the quantity of the current flowing in the selected bit line is in excess of the prescribed level while outputting a high-level signal when the quantity of the current flowing in the selected bit line is less than the prescribed level.

What is claimed is:

1. A memory comprising:
   a first conductive type first impurity region formed on the main surface of a semiconductor substrate constituting a first electrode of a diode included in a memory cell and a word line;
   a plurality of second conductive type second impurity regions formed on the surface of said first impurity region at a prescribed interval, each constituting a second electrode of said diode;
   a bit line formed on said semiconductor substrate and connected to said second impurity regions; and
   a wire provided above said bit line and including a plurality of contact portions connected to said first impurity region constituting said word line, wherein
   said plurality of contact portions are formed at a first interval apart from each other,
   said memory cell does not include a transistor but includes a diode, and
   said memory cell includes a first memory cell provided with said second impurity region and a second memory cell not provided with said second impurity region, and data of said memory cell is determined to be a first data in case of said first memory cell provided with said second impurity region and is determined to be a second data different from said first data in case of said second memory cell not provided with said second impurity region.

2. The memory according to claim 1, wherein
   said bit line is so formed as to extend in a direction intersecting with the extensional direction of said first impurity region, and
   said wire is so formed as to extend along the extensional direction of said first impurity region.

3. The memory according to claim 2, further comprising first connecting holes provided below said bit line for electrically connecting said bit line and said second impurity regions with each other, wherein
   said first connecting holes are formed in correspondence to each of said second impurity regions.

4. The memory according to claim 1, further comprising:
   a first interlayer dielectric film formed on said first impurity region and said second impurity regions, and
   a second interlayer dielectric film formed on said first interlayer dielectric film, wherein
   said wire is formed on said second interlayer dielectric film, and
   said bit line is formed between said first interlayer dielectric film and said second interlayer dielectric film.

5. The memory according to claim 4, wherein
   said first interlayer dielectric film includes a first connecting hole for electrically connecting said bit line and said second impurity regions with each other, and a conductive first plug is embedded in said first connecting hole.

6. The memory according to claim 5, wherein
said first interlayer dielectric film is so formed as to come into contact with the surfaces of said second impurity regions, and
said bit line and said second impurity regions are electrically connected with each other through said first plug embedded in said first connecting hole of said first interlayer dielectric film.

7. The memory according to claim 5, further comprising a third interlayer dielectric film formed between said first and second impurity regions and said first interlayer dielectric film, wherein
said third interlayer dielectric film is also formed with said first connecting hole while said first plug is embedded in said first connecting hole of said third interlayer dielectric film, and
said bit line and said second impurity regions are electrically connected with each other through said first plugs embedded in said first connecting holes of said first and third interlayer dielectric films.

8. The memory according to claim 7, wherein said first plug embedded in said first connecting hole of said first interlayer dielectric film and said first plug embedded in said first connecting hole of said third interlayer dielectric film are connected with each other through a first pad layer having a larger planar dimension than said first plugs.

9. The memory according to claim 4, wherein
said first and second interlayer dielectric films include second connecting holes for electrically connecting said wire and said second impurity regions with each other every prescribed interval with respect to said first impurity region.

10. The memory according to claim 9, wherein
second plugs are embedded in said second connecting holes of said first and second interlayer dielectric films.

11. The memory according to claim 10, wherein
said first interlayer dielectric film is so formed as to come into contact with the surface of said first impurity region, and
said wire and said first impurity region are electrically connected with each other through said second plugs embedded in said second connecting holes of said first and second interlayer dielectric films.

12. The memory according to claim 11, wherein
said second plug embedded in said second connecting hole of said first interlayer dielectric film and said second plug embedded in said second connecting hole of said second interlayer dielectric film are connected with each other through a second pad layer having a larger planar dimension than said second plugs.

13. The memory according to claim 11, further comprising a third interlayer dielectric film formed between said first and second impurity regions and said first interlayer dielectric film, wherein
said third interlayer dielectric film is also formed with said second connecting hole while said second plug is embedded in said second connecting hole of said third interlayer dielectric film, and
said wire and said first impurity region are electrically connected with each other through said second plugs embedded in said second connecting holes of said first, second and third interlayer dielectric films.

14. The memory according to claim 13, wherein
said second plug embedded in said second connecting hole of said first interlayer dielectric film, said second plug embedded in said second connecting hole of said second interlayer dielectric film and said second plug embedded in said second connecting hole of said third interlayer dielectric film are connected with each other through a second pad layer having a larger planar dimension than said second plugs.

15. The memory according to claim 1, wherein
a plurality of said first impurity region are so formed as to extend in a prescribed direction and arranged along a direction intersecting with said prescribed direction,
the memory further comprising a first semiconductor layer provided on an element isolation region isolating each adjacent pair of said first impurity regions from each other.

16. The memory according to claim 15, wherein
said element isolation region includes an element isolation dielectric film, and
said first semiconductor layer is formed on said element isolation dielectric film.

17. The memory according to claim 15, further comprising a mask layer formed on said first semiconductor layer.

18. The memory according to claim 15, further comprising a transistor including a gate electrode constituted of a second semiconductor layer, wherein
said first semiconductor layer and said second semiconductor layer constituting said gate electrode of said transistor are made from the same layer.

19. The memory according to claim 15, wherein
said first semiconductor layer is grounded.

20. The memory according to claim 1, wherein
data of said memory cell is determined to be a first data if a current flows into said word line through said first memory cell provided with said bit line and said second impurity region and is determined to be a second data different from said first data if a current does not flow into said word line through said second memory cell not provided with said bit line and said second impurity region.

* * * * *